US009577179B2

United States Patent
Gajek et al.

(10) Patent No.: US 9,577,179 B2
(45) Date of Patent: Feb. 21, 2017

(54) ELECTROSTATICALLY CONTROLLED MAGNETIC LOGIC DEVICE

(71) Applicants: International Business Machines Corporation, Armonk, NY (US); The Board of Trustees of the University of Alabama, Tuscaloosa, AL (US)

(72) Inventors: Marcin J. Gajek, Cortlandt Manor, NY (US); Daniel C. Worledge, Cortlandt Manor, NY (US); William H. Butler, Tuscaloosa, AL (US)

(73) Assignees: INTERNATIONAL BUSINESS MACHINES CORPORATION, Armonk, NY (US); THE BOARD OF TRUSTEES OF THE UNIVERSITY OF ALABAMA, Tuscaloosa, AL (US)

(*) Notice: Subject to any disclaimer, the term of this patent is extended or adjusted under 35 U.S.C. 154(b) by 0 days.

(21) Appl. No.: 13/761,792

(22) Filed: Feb. 7, 2013

(65) Prior Publication Data
US 2014/0217524 A1 Aug. 7, 2014

(51) Int. Cl.
*H01L 29/76* (2006.01)
*H01L 43/02* (2006.01)
*H01L 43/12* (2006.01)
*H01L 43/08* (2006.01)
*H01L 43/10* (2006.01)
*H03K 19/168* (2006.01)
*H01F 10/00* (2006.01)

(52) U.S. Cl.
CPC ............ *H01L 43/02* (2013.01); *H01F 10/002* (2013.01); *H01L 43/08* (2013.01); *H01L 43/10* (2013.01); *H01L 43/12* (2013.01); *H03K 19/168* (2013.01)

(58) Field of Classification Search
CPC ...... H01L 21/8246; H01L 29/82; H01L 43/08; H01L 27/228; H01L 43/10; H01L 43/02; B82Y 25/00; G11C 11/16; H01F 10/002; H03K 19/168
USPC ..................... 25/421; 365/171, 173; 257/295
See application file for complete search history.

(56) References Cited

U.S. PATENT DOCUMENTS

| | | | |
|---|---|---|---|
| 6,839,273 B2 | 1/2005 | Odagawa et al. | |
| 7,283,386 B2 | 10/2007 | Shin et al. | |
| 7,750,390 B2 | 7/2010 | Saito et al. | |
| 7,860,351 B2 | 12/2010 | Yagami | |
| 7,965,543 B2 | 6/2011 | Slaughter et al. | |
| 8,098,514 B2 * | 1/2012 | Nagase | H01L 27/228 365/148 |
| 2002/0024781 A1 * | 2/2002 | Ooshima et al. | 360/324.12 |
| 2002/0177013 A1 * | 11/2002 | Hiramoto et al. | 428/702 |
| 2003/0062975 A1 * | 4/2003 | Kishi et al. | 335/106 |

(Continued)

OTHER PUBLICATIONS

Disclosed Anonymously, "Method and System for Spin Injection, Spin Diffusion and Spin Manipulation of Ferromagnetic Contacts in CMOS based Architecture", IPCOM000208078D; IP.com Electronic Publication: Jun. 22, 2011; cover page, and pp. 1-4.

*Primary Examiner* — Kevin M Picardat
(74) *Attorney, Agent, or Firm* — Cantor Colburn LLP; Vazken Alexanian

(57) ABSTRACT

A magnetic logic cell includes a first electrode portion, a magnetic portion arranged on the first electrode, the magnetic portion including an anti-ferromagnetic material or a ferrimagnetic material, a dielectric portion arranged on the magnetic portion, and a second electrode portion arranged on the dielectric portion.

11 Claims, 3 Drawing Sheets

(56) References Cited

U.S. PATENT DOCUMENTS

| | | |
|---|---|---|
| 2009/0080239 A1 | 3/2009 | Nagase et al. |
| 2010/0302690 A1 | 12/2010 | Worledge |
| 2011/0049659 A1 | 3/2011 | Suzuki et al. |
| 2011/0068825 A1* | 3/2011 | Xi et al. .................. 326/47 |
| 2011/0133149 A1 | 6/2011 | Sonehara |
| 2012/0012955 A1 | 1/2012 | Ito et al. |
| 2013/0146996 A1* | 6/2013 | Yu .................. H01L 43/12 257/421 |
| 2014/0217524 A1* | 8/2014 | Gajek et al. .................. 257/421 |

* cited by examiner

ELECTROSTATICALLY CONTROLLED MAGNETIC LOGIC DEVICE

FEDERALLY SPONSORED RESEARCH AND DEVELOPMENT

This invention was made with government support under contract number N66001-11-14110 awarded by Defense Advanced Research Projects Agency. The government may have certain rights in the invention.

FIELD OF INVENTION

The present invention relates generally to method and devices involving magnetic logic devices, and more specifically, to methods and devices involving electrostatically controlled magnetic logic devices.

DESCRIPTION OF RELATED ART

FIG. 1 illustrates a side view of a prior art example of an electrostatically controlled cell (cell) 100 in a first state. In the illustrated example, the cell 100 includes a first electrode 102 connected to ground. A ferromagnet portion 104 is arranged on the first electrode 104. A dielectric portion 106 is arranged on the ferromagnet portion 104, and a second electrode 108 is arranged on the dielectric portion 106. A ferromagnetic layer has all magnetic atomic moments pointing in the same direction (and may include an alloy of 2 different compounds such as, for example CoFe). A ferrimagnetic layer has some moments pointing in one direction and some moments pointing in the opposite direction, for instance in the TbFe alloy, even though most of the alloy is amorphous and Fe and Tb sites have random spatial locations, all of the Tb atoms form a magnetic sublattice (the Tb atoms are ferromagnetically coupled to each-other) and have their moments pointing in one direction, and all of the Fe atoms form another magnetic sublattice and have their magnetic moments pointing towards the opposite direction. The magnetic moments of individual Tb and Fe atoms are different therefore even though the magnetic sublattices formed by Tb and Fe are oriented towards opposite directions they do not necessarily cancel-out each other so a macroscopic moment is possible.

The ferromagnetic portion 104 is shown with a number of arrows indicating the direction of the magnetic moment of the atoms arranged in the ferromagnetic portion 104. When a voltage (V1) is applied to the second electrode 108, the arrows are shown orientated in a first direction. The application of the voltage V1 to the second electrode affects a junction region 101 of the ferrimagnet portion 104 that is operative to impart a change in the electromagnetic energy in the system. This change results in the orientation of the atomic magnetic moment spins of the atoms in the ferromagnetic portion 104 as shown.

FIG. 2 illustrates the prior art example of the cell 100 in a second state. Referring to FIG. 2, a second voltage (V2) is applied to the second electrode 108. The application of the V2 voltage affects the junction region 101 of the ferromagnetic portion 104 that changes the orientation of the magnetic moment of the atomic sites in the ferromagnetic portion 104. In FIG. 1 the magnetic orientation is "in plane" while in FIG. 2 the magnetic orientation of the ferromagnetic portion 104 is "out of plane." GIvne the two states, the cell 100 can be used as a magnetic logic device.

BRIEF SUMMARY

According to an embodiment of the present invention, a magnetic logic cell includes a first electrode portion, a magnetic portion arranged on the first electrode, the magnetic portion including an anti-ferromagnetic material or a ferrimagnetic material, a dielectric portion arranged on the magnetic portion, and a second electrode portion arranged on the dielectric portion.

According to another embodiment of the present invention, a magnetic logic cell includes a first electrode portion, a magnetic portion arranged on the first electrode, the magnetic portion including a first layer of anti-ferromagnetic material or ferrimagnetic material, a dielectric portion arranged on the magnetic portion, and a second electrode portion arranged on the dielectric portion.

According to yet another embodiment of the present invention, a magnetic logic cell includes a first electrode portion, a magnetic portion arranged on the first electrode, the magnetic portion including a first layer of anti-ferromagnetic or ferrimagnetic material disposed on the first electrode, a dielectric portion arranged on the magnetic portion, and a second electrode portion arranged on the dielectric portion.

According to another embodiment of the present invention, a method for fabricating a magnetic logic cell includes depositing and patterning a layer of conductive material on a substrate to define a first electrode, depositing a first layer of anti-ferromagnetic or ferrimagnetic material disposed on the first electrode, depositing a dielectric material layer over the first layer of magnetic material, patterning the first layer of magnetic material, and the dielectric material layer to define a magnetic portion and a dielectric portion of the cell, and forming a second electrode portion in contact with the dielectric material layer.

According to another embodiment of the present invention, a method for fabricating a magnetic logic cell includes depositing and patterning a layer of conductive material on a substrate to define a first electrode, depositing a dielectric material layer over the first electrode, depositing a first layer of anti-ferromagnetic or ferrimagnetic material on the dielectric material layer, patterning the first layer of magnetic material, and the dielectric material layer to define a magnetic portion and a dielectric portion of the cell, and forming a second electrode portion in contact with the first layer of ferrimagnetic material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 2:
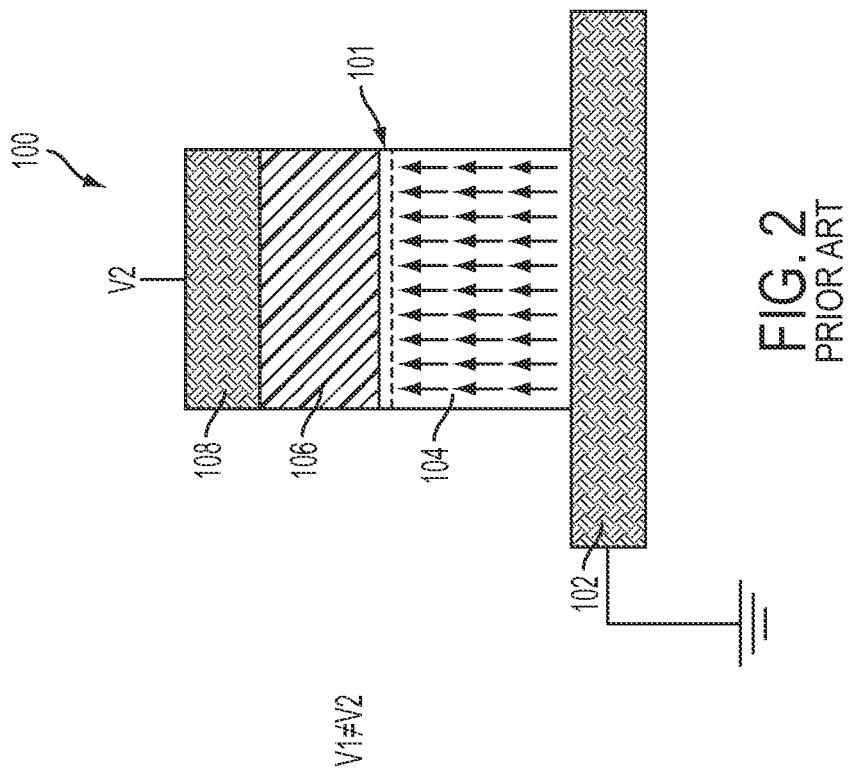
FIG. 2 illustrates a side view of the prior art example of the cell of FIG. 1 in a second state.
Figure 1:
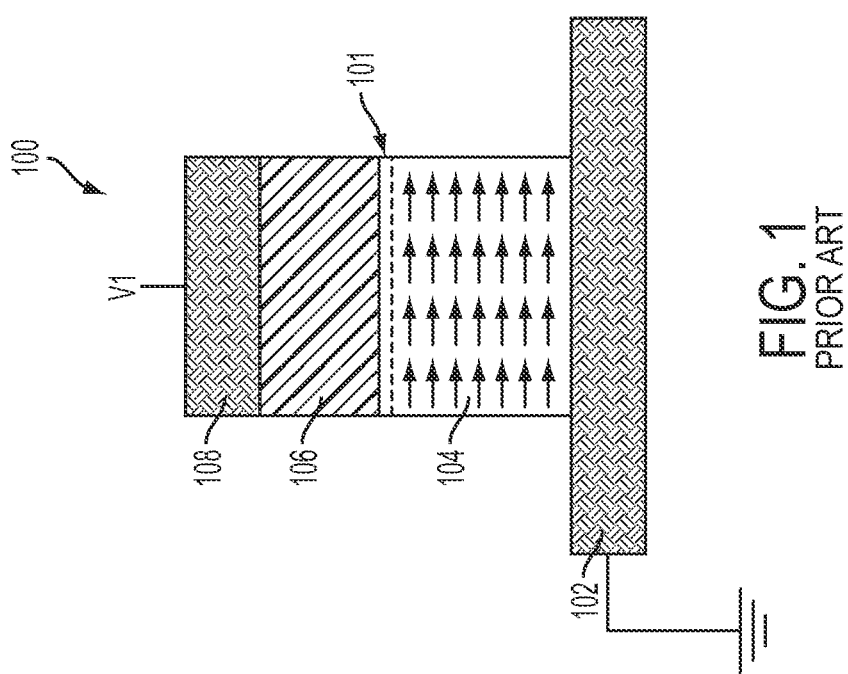
FIG. 1 illustrates a side view of a prior art example of an electrostatically controlled logic cell (cell) in a first state.
Figure 3:
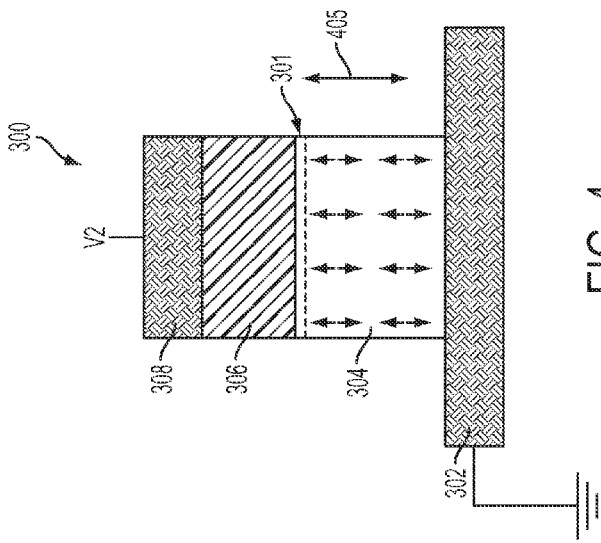
FIG. 3 illustrates an exemplary embodiment of a logic cell in a first state.

Computational schemes based on the switching of magnetic moment (spintronics) used in magnetic logic cells may be controlled using lower voltages than the voltages used in complementary metal oxide semiconductor (CMOS) based memory/logic devices. The voltage control of some devices may be less than one volt, which facilitates the use of higher clock speeds in processors. The use of devices based on ferromagnetic materials provides a low voltage control solution, however previous ferromagnetic devices have exhibited a relatively slow state switching speed (e.g., 0.5 nanoseconds). The low switching speeds are undesirable. The exemplary embodiments described below provide a device having a relatively fast switching speed with out-of-plane to in-plane reversal as fast or potentially faster than 10 ps. The exemplary embodiments include logic cells that include layers of antiferromagnets and ferrimagnets that affect a low-energy and fast voltage induced control using anisotropy control and magnetization switching FIG. 3 illustrates an exemplary embodiment of a logic cell (cell) 300 in a first state. The cell 300 includes a first conductive electrode portion 302 that is connected to ground. A ferrimagnetic (or antiferromagnetic) portion 304 is arranged in contact with the first conductive electrode portion 302. A non-conductive dielectric portion 306 is arranged on the ferrimagnetic (or antiferromagnetic) portion 304. The dielectric portion 306 may include any suitable dielectric material such as, for example, $MgO$, $HfO_2$, $Al_2O_3$, $TiO_2$ more generally all High-k dielectrics (such as ZrO2, La2O3, TiO2, $SrTiO_3$, $BaSrTiO_3$, $PbLaTiO_3$). A second conductive electrode portion 308 is arranged on the dielectric portion 306. The cell 300 may be arranged on a substrate (not shown) and may be arranged in an array with any number of cells 300.

The first and second conductive electrode portions 302 and 308 may include any suitable conductive material such as, for example, Al, Au, Ag, Pt, Pd, Ti, Ta, Ru or Cu and so on. The ferrimagnetic (or antiferromagnetic) portion 304 is illustrated with arrows that indicate the direction of the magnetic moment of the atoms that are arranged in the ferrimagnetic (or antiferromagnetic) portion 304. In the illustrated embodiment, a first voltage V1 is applied to the second conductive electrode portion 308 such that the magnetic orientation of the ferrimagnetic (or antiferromagnetic) portion 304 is shown "in plane" however, the orientation of the spins are in opposing directions. In this regard, the sum of the vectors representing the orientation of the magnetic moments is approximately zero or close to zero. The ferrimagnetic (or antiferromagnetic) portion 304 may include, for example, an alloy material such as, for example $Tb_{1-x}Fe_x$, $Gd_{1-x}Fe_x$, $Dy_{1-x}Fe_x$, $Tb_{1-x-y}Fe_xCo_y$, $Gd_{1-x-y}Fe_xCo_y$, $Dy_{1-x-y}Fe_xCo_y$ more generally materials containing rare earth metals and magnetic transition metals elements, in which the magnetic sublattice of rare earth ions and the one formed by the Transition metal ions are antiferromagnetically coupled so that the moment of the two sublattices are pointing towards opposite directions. Moment compensation is reached when the two sublattices have equal but opposite moments.

Figure 4:
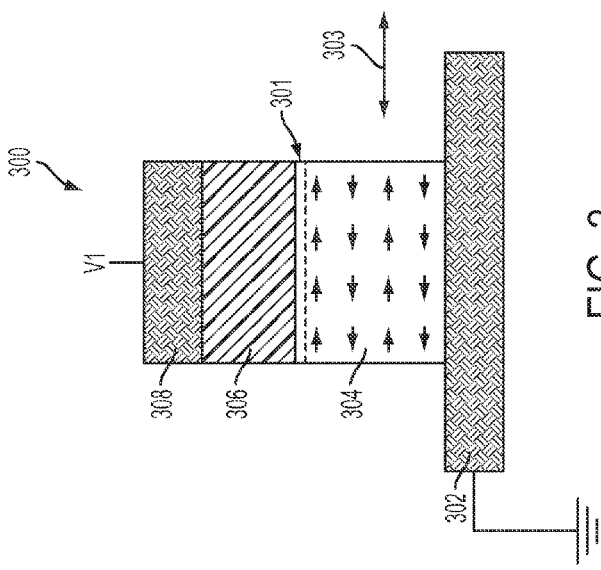
FIG. 4 illustrates the exemplary embodiment of the logic cell of FIG. 3 in a second state.

FIG. 4 illustrates the cell 300 in a second state where a second voltage V2 is applied to the second conductive electrode 308. The application of the V2 voltage results in a change in state of the ferrimagnetic (or antiferromagnetic) portion 304 such that the orientation of the spins of the atoms is "out of plane" however, the directions of the magnetic moments of the atoms are in opposing directions. The cell 300 may be fabricated by, depositing a layer of conductive metallic material such as, for example, Al, Au, Ag, Pt, Pd, Ti, Ta, Ru or Cu on a substrate. Portions of the layer of conductive metallic material may be removed by, for example, a lithographic patterning and etching process. A layer of ferrimagnetic material such as, for example $Tb_{1-x}Fe_x$, $Gd_{1-x}Fe_x$, $Dy_{1-x}Fe_x$, $Tb_{1-x-y}Fe_xCo_y$, $Gd_{1-x-y}Fe_xCo_y$, $Dy_{1-x-y}Fe_xCo_y$. The layers can be fabricated by using, for example, a magnetron sputtering technique by either deposition directly from a single phase sputtering source such as $Tb_{1-x}Fe_x$ or cosputtering using two or more sources namely one for the rare earth metal such as for instance Tb and one or two for the transition metal such as Fe. A dielectric layer is disposed on the layer of ferrimagnetic material, which may include any suitable dielectric material such as, for example, $MgO$, $HfO_2$, $Al_2O_3$, $TiO_2$ more generally all High-k dielectrics (such as ZrO2, La2O3, TiO2, $SrTiO_3$, $BaSrTiO_3$, $PbLaTiO_3$). A second layer of conductive metallic material is disposed on the dielectric layer. A suitable lithographic etching process may be performed to pattern the cell 300 as illustrated in FIG. 3.

Figure 5:
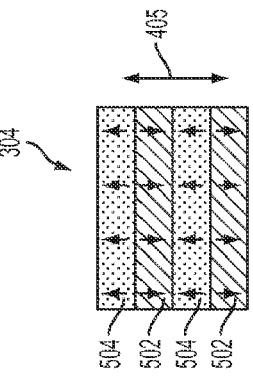
FIG. 5 illustrates another exemplary embodiment of the ferrimagnetic portion.

FIG. 5 illustrates an alternate exemplary embodiment of the ferrimagnetic (or antiferromagnetic) portion 304 in the first state as shown in FIG. 3. It shall be understood that portion 304 may also be considered an "artificial ferrimagnet" as it may be composed of ferromagnetic layers each at least several atoms thick In this regard, the ferrimagnetic (or antiferromagnetic) portion 304 is formed from layers 502 and 504 of alternating materials having thicknesses of the order of 2-20 Å, for example Tb 20 Å/Fe 20 Å . . . The layer 502 includes a ferromagnetic material such as, for example, Tb, Dy, or Gd, Nd, Sm more generally all of the rare earth metals. The layer 504 disposed on the layer 502 includes a ferromagnetic material such as, for example, Fe, Co, Ni, $Co_xFe_{1-x}$, $Co_{1-x-y}Fe_xB_y$. The respective magnetic properties of the layers 502 and 504 and the relative [antiferromagnetic] arrangement of the layers 502 and 504 results in a ferrimagnetic (or antiferromagnetic) portion 304 that has a magnetic moment that is substantially neutral or substantially close to zero (e.g., 0-20 electro magnetic units (EMU) per cubic centimeter; i.e., at or close to the magnetization compensation point). Though the layer 504 is shown in contact with the dielectric portion 306 in the illustrated embodiment, in an alternate embodiment, a layer 502 may be in contact with the dielectric portion 306. In some embodiments, an ultra thin metal layer may be inserted or "dusted" in the interface between the dielectric portion 306 and the ferrimagnetic (or antiferromagnetic) portion 304. (e.g, with a thickness of the order of a monolayer or 2-3 Å) in order to enhance the contribution to the surface magnetic anisotropy of layer 304, for instance metallic layer such as Pt or Pd or Bi or more generally metals with a high atomic number hence with a high spin orbit coupling.

Figure 6:
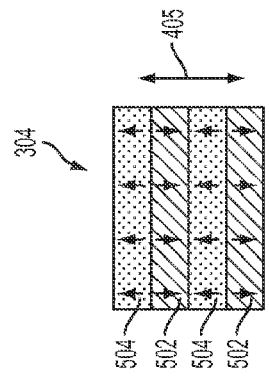
FIG. 6 illustrates another exemplary embodiment of the ferrimagnetic portion.

FIG. 6 illustrates the ferrimagnetic (or antiferromagnetic) portion 304 as described in FIG. 5 when the cell 300 in in the second state. In this regard, the layers 502 and 504 have atoms with magnetic moments that are perpendicular to the plane of the film, however the magnetic moments are orientated in opposing directions.

Figure 7:
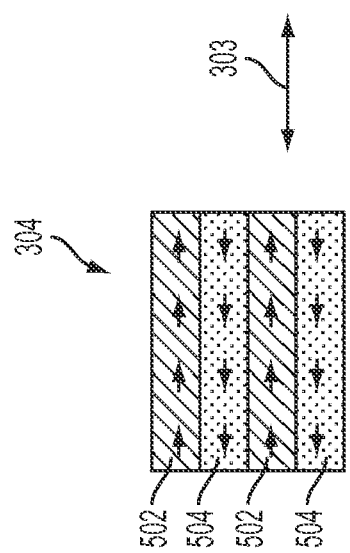
FIG. 7 illustrates another exemplary embodiment of the ferrimagnetic portion.

FIG. 7 illustrates an alternate exemplary embodiment of the ferrimagnetic (or antiferromagnetic) portion 304 in the first state as shown in FIG. 3. In this regard, the ferrimagnetic (or antiferromagnetic) portion 304 is formed from layers 502 and 504 as described above in FIG. 5, however the layer 504 that includes a ferromagnetic material such as a transition metal, like Fe, Co, or Ni, is disposed on the second electrode portion 302 (of FIG. 3), and the layer 502 that includes a second ferromagnetic material such as for instance a rare earth ferromagnet, like Tb or Gd, is disposed on the layer 504, the thicknesses are chosen so that 502 and 504 are coupled antiferromagnetically. Any number of alternating pairs of layers 504 and 502 may be included in the ferrimagnetic (or antiferromagnetic) portion 304.

Figure 8:
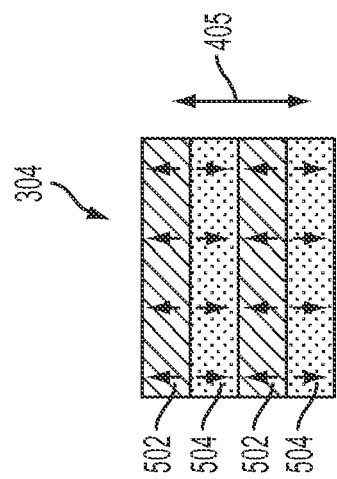
FIG. 8 illustrates another exemplary embodiment of the ferrimagnetic portion.

FIG. 8 illustrates the ferrimagnetic (or antiferromagnetic) portion 304 as described in FIG. 7 when the cell 300 in in the second state. In this regard, the layers 502 and 504 have atoms with magnetic moments that are out of plane, however the magnetic moments are orientated in opposing directions.

The combination of the transition metal and the rare earth in the ferrimagnetic (or antiferromagnetic) portion 304 result in a small (zero or near zero) moment. Thus, at a given applied voltage, the ferrimagnetic (or antiferromagnetic) portion 304 undergoes a higher effective field (electric and magnetic) as compared to devices having ferromagnets. Each sublattice is subjected to the exchange field (orientated in an opposing direction to an adjacent sublattice) of the adjacent sublattice. The additional field appears to increase the damping rate and provides for faster magnetization dynamics. The effect provides very fast reversal of the magnetization of the MRAM device 300 with voltage-induced anisotropy modulation at the interface 301 of the dielectric portion 306 and the ferrimagnetic (or antiferromagnetic) portion 304.

The application of the voltage to the top electrode 108 induces an electric field across the dielectric in region 106 and results in a change in the carrier concentration of the interfacial region 101 thereby changing the contribution of this region to the overall magnetic anisotropy of the magnetic film 104. This results in a rotation of the magnetic moments on each atomic site of the region 104. The anisotropy axis defines the energetically favorable direction for the magnetic moments of a given material when no magnetic field is applied to portion 304 and interfacial anisotropies form region 301. (This includes the contribution from the bulk and the surface/interface, or portion 301, of the given material with the dielectric portion 306, the magnetic moment direction is the sum or total contributions of both bulk anisotropies from portion 304 and surface anisotropies from portion 301, the latter interfacial contribution may be modulated with the electric field, hence the magnetic moment of portion 304 and 301 can be rotated when the surface anisotropy represents more than 50% of the total anisotropy (bulk+interface) which is the case only of very thin magnetic layers of less than 20 Å).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A magnetic logic cell comprising:
   a first electrode portion;
   a magnetic portion formed of magnetic material arranged directly on the first electrode, the magnetic portion including a first lattice formed by rare earth metal ions and a second lattice formed by a transition metal ions and directly contacting the first lattice, the first and second lattices are anti-ferromagneticly coupled so that moments of the first and second lattices point towards opposite directions and have equal and opposite moments;
   a dielectric portion arranged directly on the magnetic portion; and
   a second electrode portion arranged on the dielectric portion.

2. The cell of claim 1, wherein the magnetic portion has a net magnetic moment of approximately a compensation point of the magnetic portion.

3. The cell of claim 1, wherein the first electrode portion and the second electrode portion include a conductive material.

4. The cell of claim 1, wherein the magnetic orientation of the magnetic portion is operative to change states when a voltage is applied to the first electrode portion.

5. A magnetic logic cell comprising:
   a first electrode portion;
   a first layer of an magnetic material arranged directly on the first electrode the magnetic portion including a first lattice formed by rare earth metal ions and a second lattice formed by a transition metal ions and directly contacting the first lattice, the first and second lattices are anti-ferromagneticly coupled so that moments of the first and second lattices point towards opposite directions and have equal and opposite moments;

a dielectric portion arranged directly on the first layer; and
a second electrode portion arranged on the dielectric portion.

6. The cell of claim 5, wherein the magnetic portion has a net magnetic moment of approximately a compensation point of the magnetic portion.

7. The cell of claim 5, wherein the layer of magnetic material is arranged in contact with the first electrode portion.

8. The cell of claim 5, wherein the first electrode portion and the second electrode portion include a conductive material.

9. The cell of claim 5, wherein the magnetic orientation of the magnetic portion is operative to change states when a voltage is applied to the first electrode portion.

10. A magnetic logic cell comprising:
a first electrode portion;
a first layer of a magnetic material disposed directly on the first electrode, the magnetic material including a first lattice formed by rare earth metal ions and a second lattice formed by a transition metal ions and directly contacting the first lattice, the first and second lattices are anti-ferromagneticly coupled so that moments of the first and second lattices point towards opposite directions and have equal and opposite moments;
a dielectric portion arranged directly on the first layer; and
a second electrode portion arranged on the dielectric portion.

11. The cell of claim 10, wherein the magnetic material has a net magnetic moment of approximately a compensation point of the magnetic portion.

* * * * *